United States Patent
Yang et al.

(10) Patent No.: US 8,120,120 B2
(45) Date of Patent: Feb. 21, 2012

(54) EMBEDDED SILICON GERMANIUM SOURCE DRAIN STRUCTURE WITH REDUCED SILICIDE ENCROACHMENT AND CONTACT RESISTANCE AND ENHANCED CHANNEL MOBILITY

(75) Inventors: Frank (Bin) Yang, Mahwah, NJ (US); Johan W. Weijtmans, Hopewell Junction, NY (US); Scott Luning, Poughkeepsie, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 118 days.

(21) Appl. No.: 12/561,685

(22) Filed: Sep. 17, 2009

(65) Prior Publication Data
US 2011/0062498 A1   Mar. 17, 2011

(51) Int. Cl.
*H01L 29/772* (2006.01)
*H01L 21/335* (2006.01)

(52) U.S. Cl. ............... 257/384; 257/213; 257/E29.242; 257/E21.4; 257/E21.438; 438/300

(58) Field of Classification Search .................. 257/213, 257/384, E29.242, E21.4, E21.438; 438/300
See application file for complete search history.

(56) References Cited

U.S. PATENT DOCUMENTS

| | | | |
|---|---|---|---|
| 2008/0157119 A1* | 7/2008 | Tsai ............................... | 257/190 |
| 2008/0185612 A1* | 8/2008 | Fukuda et al. ................. | 257/190 |
| 2008/0197412 A1* | 8/2008 | Zhang et al. ................... | 257/344 |
| 2008/0246057 A1* | 10/2008 | Lin et al. ........................ | 257/190 |
| 2009/0108308 A1* | 4/2009 | Yang et al. ..................... | 257/288 |
| 2011/0014765 A1* | 1/2011 | Fukuda et al. ................. | 438/285 |
| 2011/0024804 A1* | 2/2011 | Chang et al. ................... | 257/288 |
| 2011/0101305 A1* | 5/2011 | Yu et al. .......................... | 257/18 |

* cited by examiner

*Primary Examiner* — Victor A Mandala
(74) *Attorney, Agent, or Firm* — Ditthavong Mori & Steiner, P.C.

(57) ABSTRACT

Semiconductor devices with embedded silicon germanium source/drain regions are formed with enhanced channel mobility, reduced contact resistance, and reduced silicide encroachment. Embodiments include embedded silicon germanium source/drain regions with a first portion having a relatively high germanium concentration, e.g., about 25 to about 35 at. %, an overlying second portion having a first layer with a relatively low germanium concentration, e.g., about 10 to about 20 at. %, and a second layer having a germanium concentration greater than that of the first layer. Embodiments include forming additional layers on the second layer, each odd numbered layer having relatively low germanium concentration, at. % germanium, and each even numbered layer having a relatively high germanium concentration. Embodiments include forming the first region at a thickness of about 400 Å to 28 about 800 Å, and the first and second layers at a thickness of about 30 Å to about 70 Å.

18 Claims, 3 Drawing Sheets

EMBEDDED SILICON GERMANIUM SOURCE DRAIN STRUCTURE WITH REDUCED SILICIDE ENCROACHMENT AND CONTACT RESISTANCE AND ENHANCED CHANNEL MOBILITY

TECHNICAL FIELD

The present disclosure relates to a method of fabricating semiconductor devices with embedded silicon germanium (eSiGe) source/drain regions, and to the resulting devices. The present disclosure is particularly applicable to semiconductor devices with boron doped eSiGe source/drain regions.

BACKGROUND

For the 32 nanometer (nm) technology node, source/drain regions in a PMOS semiconductor element are typically formed of 20% eSiGe, i.e., eSiGe with 20 at. % germanium (Ge), and exhibit enhanced channel strain thereby increasing hole mobility for increased speed. Boron (B) is typically introduced as a dopant to reduce contact resistance. Adverting to FIG. 1, cavities 101, defined by spacers 105, made of oxide or nitride, are formed in an active silicon layer 103 on each side of semiconductor gate 107, as by reactive ion etching. Silicon germanium (SiGe) is then epitaxially grown in the cavities 101 and doped with B. A silicide layer 109 is then formed on the SiGe, using a spacer, such as silicon nitride (SiN) spacer 111 as a mask. As illustrated in FIG. 1, silicide layer 109 in the 20% eSiGe is well-contained, has a uniform thickness, and lines up along the SiN spacer 111.

However, Boron solubility in 20% eSiGe is low, for example a concentration of less than 1E20 cm-3 for chemical boron and about 5E19 cm-3 for electrically active Boron. It would be desirable to increase the amount of Ge to at least 30 at. % to achieve higher B solubility, e.g., greater than 5E20 cm-3 for chemical B (which is about five times greater than in 20% eSiGe) and about 2E20 cm-3 for electrically active B (which is about four times greater than in 20% eSiGe). The high active B concentration provides a low silicide-to-eSiGe contact resistance (Rc). For example, 20% eSiGe has a value of Rc that is 2 to 3 times that of 30% eSiGe. In addition, 30% eSiGe has a higher strain than 20% eSiGe, e.g., about a 50% increase in strain. Thus, 30% eSiGe provides two desirable benefits over 20% eSiGe, i.e., enhanced channel mobility by enhancing channel strain, and reduced silicide-to-eSiGe Rc.

However, there are significant disadvantages attendant upon employing 30% eSiGe compared with 20% eSiGe. Adverting to FIG. 2, when 30% eSiGe is used for the source/drain regions 201, the silicide 203 is no longer well contained along the SiN spacer, but encroaches vertically (207) as well as laterally (205), thereby undesirably reducing channel stress and causing source-drain to channel junction leakage. Whereas the depth of the silicide is normally about 200 Å in 20% eSiGe, the depth in 30% eSiGe extends approximately an additional 100 Å from the bottom of the SiN spacer. Further, variations on the right side of the gate differ from those on the left side. The uncontrollable silicide depth and width causes eSiGe strain relaxation and creates silicide pipes at the eSiGe-to-silicon interface, thereby causing junction leakage.

A proposed solution to mitigate the silicide encroachment issue is illustrated in FIG. 3, and comprises growing a region of 30% eSiGe (301) as to a thickness of about 400 angstroms (Å) to about 800 Å, e.g., about 600 Å, and then growing a layer 303 of 20% eSiGe on the 30% eSiGe region, as to a thickness of about 200 Å to about 400 Å. As shown in FIG. 3, silicide 305 formed in the 20% eSiGe portion is well contained, with a uniform thickness and no lateral or vertical encroachment. However, 20% eSiGe exhibits significantly less strain than 30% eSiGe, thereby reducing channel mobility. In addition, active B in 20% eSiGe is limited to less than 6E19 cm-3, resulting in high silicide-to-eSiGe Rc. To lower the Rc, the active B concentration must be raised to at least 2E20 cm-3, which requires implanting B. However, implantation of B causes undesirable strain relaxation. Further, implanted B requires high temperature rapid thermal anneal (RTA), e.g., about 900° C. to about 1300° C., for activation, resulting in significant B diffusion that can overrun the extension and degrade the device short channel control. In contrast, high concentration (about 2 to 5e20 cm-3) B incorporated in situ is already active and, therefore, only requires low temperature RTA, e.g., about 900° C. to about 1000° C.

A need therefore exists for semiconductor devices having eSiGe source/drain regions with well contained silicide without lateral and vertical encroachment, and which exhibit high strain, enhanced channel mobility, and low silicide-to-eSiGe Rc, and for efficient enabling fabrication techniques.

SUMMARY

An aspect of the present disclosure is an efficient method of fabricating a semiconductor device with eSiGe source/drain regions exhibiting reduced silicide encroachment, reduced Rc, and increased channel mobility.

Another aspect of the present disclosure is a semiconductor with eSiGe source/drain regions exhibiting reduced silicide encroachment, reduced Rc, and increased channel mobility.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method forming eSiGe source/drain regions in a substrate, wherein eSiGe source/drain regions comprise: a first portion having a first percentage of Ge; and a second portion on the first portion, the second portion comprising: a first layer having a second percentage of Ge less that the first percentage; and a second layer having a third percentage of Ge greater than the second percentage.

Aspects of the present disclosure include forming a gate electrode, having first and second side surfaces, on the substrate; forming first spacers on the first and second side surfaces of the gate electrode; and forming the eSiGe source/drain regions in the substrate adjacent the first spacers. Other aspects includes forming a third layer, having the second percentage of Ge, on the second layer and forming a fourth layer, having the third percentage of Ge, on the third layer. Another aspect includes the first and third percentages being substantially the same. Further aspects include the first percentage being about 25 to about 35 at. % Ge; and the second percentage being about 10 to about 20 at. % Ge. Additional aspects include forming the first region at a thickness of about 400 Å to about 800 Å; and forming the first and second layers each at a thickness of about 30 Å to about 70 Å. Other aspects include forming a silicide extending into the second portion of the eSiGe but not into the first portion. A further aspect includes forming the eSiGe source/drain regions by epitaxial growth. An additional aspect includes forming a fifth layer, having the second percentage of Ge, on the fourth layer; and forming a sixth layer, having the first percentage of Ge, on the fifth layer.

Another aspect of the present disclosure is a semiconductor device comprising eSiGe source/drain regions in a substrate, wherein the eSiGe source/drain regions comprise: a first portion having a first percentage of Ge; and second portion on the first portion, the second portion comprising: a first layer having a second percentage of Ge less than the first percentage; and a second layer having a third percentage of Ge greater than the second percentage.

Aspects include a gate electrode, having first and second side surfaces, on the substrate; and first spacers on the first and second side surfaces of the gate electrode, wherein the eSiGe source/drain regions are in the substrate adjacent the first spacers. Other aspects include a third layer, having the second percentage of Ge, on the second layer and a fourth layer, having the third percentage of Ge, on the third layer. Another aspect includes the first and third percentages being substantially the same. Further aspects include the first percentage being about 25 to about 35 at. % Ge; and the second percentage is about 10 to about 20 at. % Ge. An additional aspect includes the first region having a thickness of about 400 Å to about 800 Å; and the first and second layers each having a thickness of about 30 Å to about 70 Å. A further aspect includes a silicide extending into the second portion of the eSiGe but not into the first portion. Another aspect includes a fifth layer, having the second percentage of Ge, on the fourth layer; and a sixth layer, having the first percentage of Ge, on the fifth layer.

A further aspect of the present disclosure includes a method comprising: forming a gate electrode, having first and second side surfaces, on an active silicon substrate; forming first spacers on the first and second side surfaces of the gate electrode; etching first and second cavities, defined by the first spacers, in the active silicon layer; forming eSiGe source/drain regions by: epitaxially growing a first portion of silicon germanium in the first and second cavities at a thickness of about 400 Å to about 800 Å, the first silicon germanium comprising at least 25 atomic % Ge; epitaxially growing a first layer, comprising about 20 at. % Ge or less, at a thickness of about 30 Å to about 70 Å. on the first portion; epitaxially growing a second layer, comprising at least 25 atomic % Ge, at a thickness of about 30 Å to about 70 Å, on the first layer; and epitaxially growing a third layer, comprising about 20 at. % Ge or less, at a thickness of about 30 Å to about 70 Å. on the second layer; forming second spacers on the first spacers; and forming a silicide, at a thickness of about 200 Å extending into the eSiGe source/drain regions but not into the first portion.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
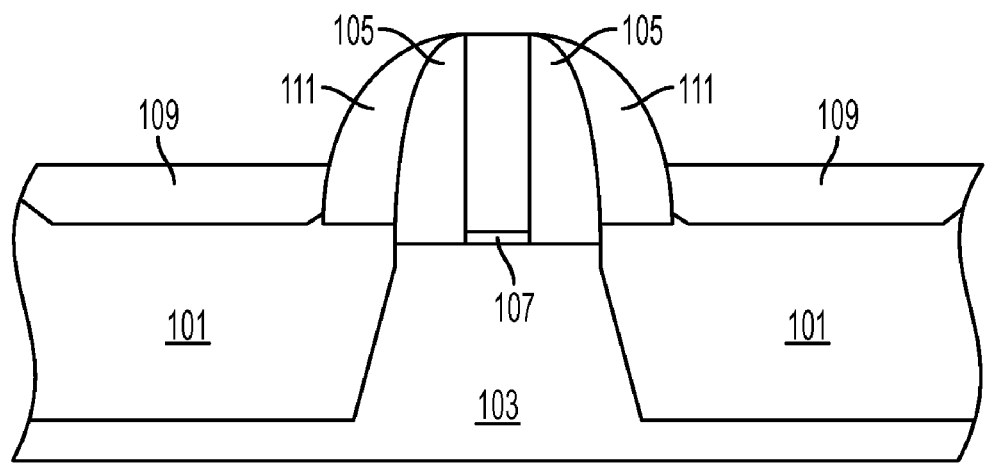
FIG. 1 schematically illustrates a prior art PMOS device with 20% eSiGe source/drain regions.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problems of low channel mobility and high silicide-to-eSiGe contact resistance that occur with 20% eSiGe and also eSiGe strain relaxation and junction leakage that occur with 30% eSiGe. In accordance with embodiments of the present disclosure alternating thin layers of 20% eSiGe and 30% eSiGe are formed on a thick layer of 30% eSiGe. As a consequence of using the 20% germanium eSiGe, the silicide depth and width is controlled, and the addition of 30% eSiGe layers raises the active B concentration in the silicide. This in turn enhances the channel strain and reduces the silicide Rc.

Embodiments of the present disclosure include a method in which eSiGe source/drain regions are formed in a substrate, e.g., by epitaxial growth. The eSiGe source/drain regions may comprise a first portion having a first percentage of Ge and a second portion, on the first portion. The second portion may comprise a first layer having a second percentage of Ge less that the first percentage, and a second layer having a third percentage of Ge greater than the second percentage. In accordance with embodiments of the present disclosure one or more additional layers may be consecutively formed on the second layer with alternating low and high percentages of Ge. For example, each odd numbered layer has the second percentage of Ge and each even numbered layer has the third percentage of Ge. The first and third percentages may be substantially the same, e.g., about 25 to about 35 at. % Ge, and the second percentage may be about 10 to about 20 at. % Ge. The first region may be formed at a thickness of about 400 Å to about 800 Å, and the first and second layers each may be formed at a thickness of about 30 Å to about 70 Å. A gate electrode, having first and second side surfaces, may be formed on the substrate, first spacers may be formed on the first and second side surfaces of the gate electrode, and the eSiGe source/drain regions may be formed in the substrate adjacent the first spacers. A silicide may be formed to extend into the second portion of the eSiGe but not into the first portion.

A semiconductor device in accordance with embodiments of the present disclosure includes eSiGe source/drain regions in a substrate, the eSiGe regions comprising a first portion having a first percentage of Ge, and a second portion on the first portion. The second portion may comprise a first layer having a second percentage of Ge less than the first percentage, and a second layer having a third percentage of Ge greater than the second percentage. The first portion may have a thickness of about 400 Å to about 800 Å, and the first and second layers may each have a thickness of about 30 Å to about 70 Å. The first and third percentages may be substantially the same, for example about 25 to about 35 at. % Ge, and the second percentage may be about 10 to about 20 at. % gGe. The device may include additional layers on the second layer, each odd numbered layer, such as a third layer, having the second percentage of Ge, and each even numbered layer, e.g., a fourth layer, having the third percentage of Ge. The device may include a gate electrode, having first and second side surfaces, on the substrate, and first spacers on the first and second side surfaces of the gate electrode, wherein the eSiGe source/drain regions are in the substrate adjacent the first spacers. The device may also include a silicide extending into the second portion of the eSiGe but not into the first portion.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
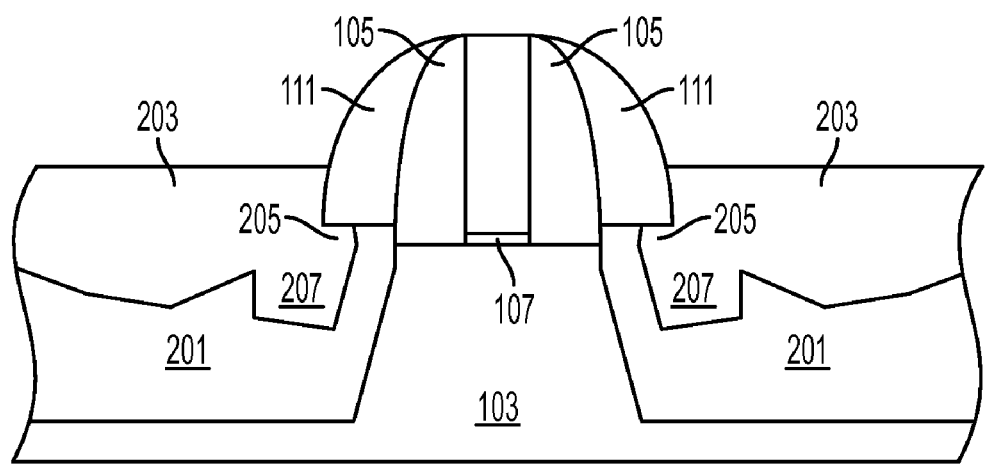
FIG. 2 schematically illustrates a prior art PMOS device with 30% eSiGe source/drain regions.
Figure 3:
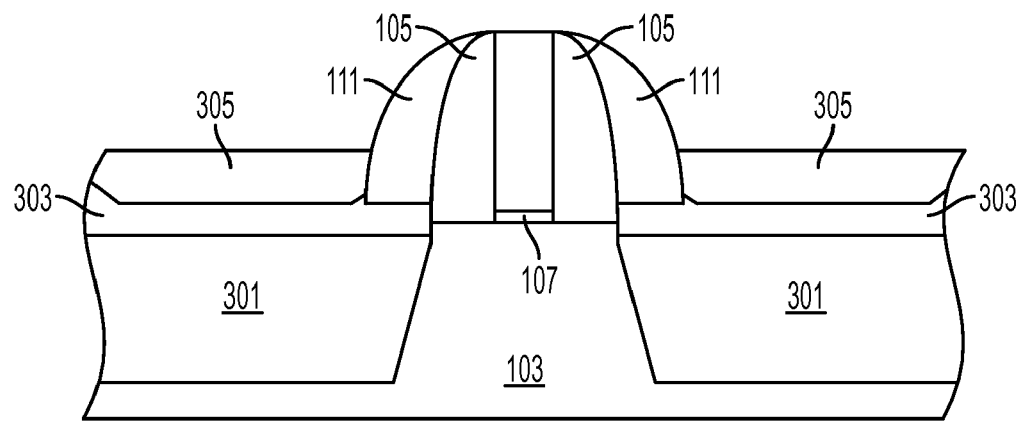
FIG. 3 schematically illustrates a PMOS device with a 20% eSiGe layer over the 30% eSiGe in the source/drain regions.
Figure 4:
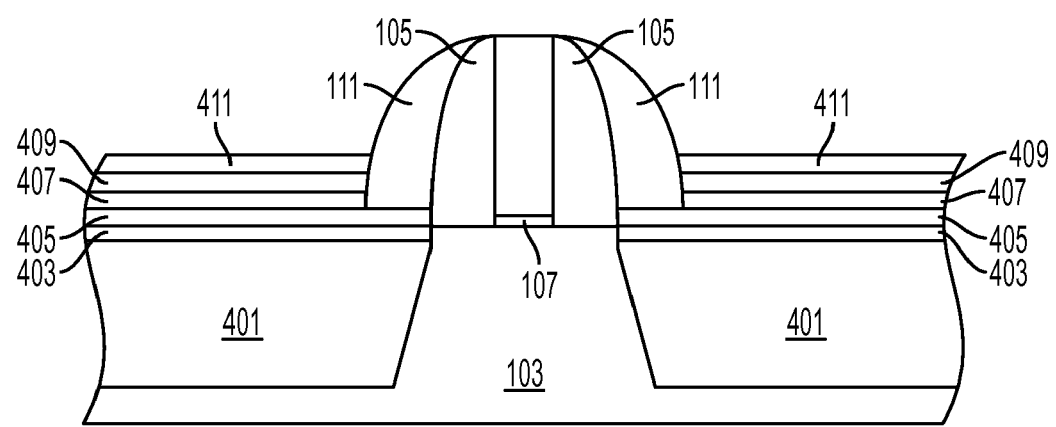
FIG. 4 schematically illustrates a PMOS device prior to formation of a silicide, according to an exemplary embodiment.
Figure 5:
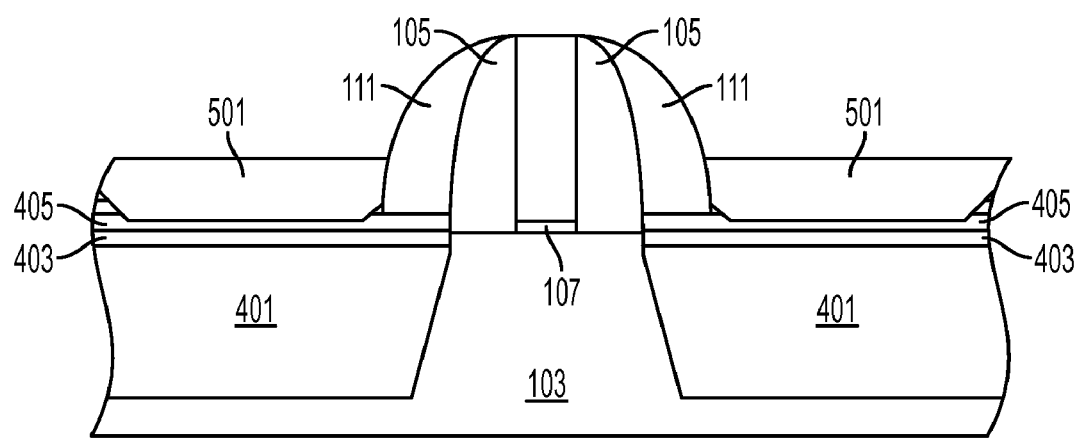
FIG. 5 schematically illustrates the PMOS device of FIG. 4 after formation of a silicide, according to an exemplary embodiment.

Adverting to FIGS. 4 and 5, a method in accordance with an embodiment of the present disclosure is illustrated. Elements that are the same as in FIGS. 1 through 3 have like reference numerals. In FIG. 4, cavities, defined by oxide spacers 105, are formed in active silicon layer 103 on each side of a semiconductor gate electrode 107 by reactive ion etching. Gate electrode 107 may be any type of gate, e.g., polysilicon or metal with a high-K dielectric. However, for a high-K/metal gate, an additional nitride spacer should be formed between oxide spacer 105 and gate 107.

Once the cavities are formed, eSiGe with a high concentration of Ge, e.g., at least about 25%, for example, about 30%, is epitaxially grown in the cavities to a thickness of about 400 Å to about 800 Å, for example 600 Å, to form layer 401. High concentration eSiGe will hereinafter be referred to as 30% eSiGe. Next, a relatively thin layer 403 of eSiGe with a low concentration of Ge, e.g., less than or equal to about 20%, e.g. about 10 to about 20%, for example, about 20%, is epitaxially grown on layer 401. The thickness of layer 403 may range from about 30 to about 70 Å, e.g., about 50 Å. Low concentration eSiGe will hereinafter be referred to as 20% eSiGe. Another thin layer, 405, formed of 30% eSiGe is grown on the 20% eSiGe to a thickness of about 30 to about 70 Å, e.g., about 50 Å. Additional thin layers 407, 409, 411, etc., may be epitaxially grown on layer 405, alternating between 20% eSiGe and 30% eSiGe, with the thickness of each layer being about 30 to about 70 Å, e.g., about 50 Å.

The eSiGe is doped in situ with Boron. The B concentration in the 30% eSiGe may be about 2 to 5E20 cm-3, and the B concentration in the 20% eSiGe may be below about 1E20 cm-3, such as 5E19 cm-3.

After the eSiGe layers are grown and doped, the layers are annealed with low temperature RTA. Then, nitride spacers 111 are formed on oxide spacers 105 to define contact regions. As illustrated in FIG. 5, a silicide 501 is then formed in the thin eSiGe layers in the contact regions. Silicide 501 may, for example, be nickel and platinum silicide, e.g., with about 5 to about 15 or 20% nickel. As illustrated in FIG. 5, silicide 501 is well contained in a thin eSiGe layer, with no vertical or horizontal encroachment.

The inserted 30% eSiGe layers in the contact region offer higher B (up to about 2E20 cm-3, which is four times higher than 20% eSiGe). Further, after RTA, the high B diffuses into the 20% eSiGe, thereby increasing the B in the silicide region such that it is significantly higher than in the uniform 20% eSiGe layer. The higher B concentration reduces the silicide Rc.

In addition, the 20% eSiGe serves as a silicide containing layer to minimize silicide encroachment. As the silicide, e.g., nickel, cobalt, nickel-platinum silicide, is well contained in the multi-layer contact region, the main 30% eSiGe layer 401 is left unsilicided, unlike with a uniform 30% eSiGe, wherein part of the 30% eSiGe below the gate oxide level becomes silicided, as in FIG. 2. Thus, the PMOS channel strain may be enhanced as compared with FIG. 2. Further the eSiGe consumption by silicide is minimized thereby preserving more eSiGe stressor in volume, improving channel stress, and improving the PMOS performance.

The embodiments of the present disclosure can achieve several technical effects, including a semiconductor device with increased channel strain and Boron solubility, which enhances channel mobility and reduces silicide-to-eSiGe contact resistance, respectively. The enhanced hole mobility in turn increases the speed of the device. The present disclosure enjoys industrial applicability in fabricating any of various types of highly integrated semiconductor devices with epitaxially grown eSiGe source and drain regions.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming embedded silicon germanium source/drain regions in a substrate, wherein the embedded silicon germanium source/drain regions comprise:
   a first portion having a first percentage of germanium; and
   a second portion on the first portion, the second portion comprising:
   a first layer having a second percentage of germanium less that the first percentage; and
   a second layer having a third percentage of germanium greater than the second percentage; and
   forming a silicide extending into the second portion of the embedded silicon germanium but not into the first portion.

2. The method according to claim 1, further comprising:
   forming a gate electrode, having first and second side surfaces, on the substrate;
   forming first spacers on the first and second side surfaces of the gate electrode; and
   forming the embedded silicon germanium source/drain regions in the substrate adjacent the first spacers.

3. The method according to claim 1, further comprising forming a third layer, having the second percentage of germanium, on the second layer.

4. The method according to claim 3, further comprising forming a fourth layer, having the third percentage of germanium, on the third layer.

5. The method according to claim 4, wherein the first and third percentages are substantially the same.

6. The method according to claim 1, wherein:
the first percentage is about 25 to 35 at. % germanium; and
the second percentage is about 10 to about 20 at. % germanium.

7. The method according to claim 1, comprising:
forming the first region at a thickness of about 400 Å to about 800 Å; and
forming the first and second layers each at a thickness of about 30 Å to about 70 Å.

8. The method according to claim 1, comprising forming the embedded silicon germanium source/drain regions by epitaxial growth.

9. The method according to claim 5, comprising:
forming a fifth layer, having the second percentage of germanium, on the fourth layer; and
forming a sixth layer, having the first percentage of germanium, on the fifth layer.

10. A semiconductor device comprising:
embedded silicon germanium source/drain regions in a substrate, wherein the embedded silicon germanium source/drain regions comprise:
a first portion having a first percentage of germanium; and
second portion on the first portion, the second portion comprising:
a first layer having a second percentage of germanium less than the first percentage; and
a second layer having a third percentage of germanium greater than the second percentage; and
a silicide extending into the second portion of the embedded silicon germanium but not into the first portion.

11. The semiconductor device according to claim 10, further comprising:
a gate electrode, having first and second side surfaces, on the substrate; and
first spacers on the first and second side surfaces of the gate electrode, wherein the embedded silicon germanium source/drain regions are in the substrate adjacent the first spacers.

12. The semiconductor device according to claim 10, further comprising a third layer, having the second percentage of germanium, on the second layer.

13. The semiconductor device according to claim 12, further comprising a fourth layer, having the third percentage of germanium, on the third layer.

14. The semiconductor device according to claim 13, wherein the first and third percentages are substantially the same.

15. The semiconductor device according to claim 10, wherein:
the first percentage is about 25 to 35 at. % germanium; and
the second percentage is about 10 to about 20 at. % germanium.

16. The semiconductor device according to claim 10, wherein:
the first region has a thickness of about 400 Å to about 800 Å; and
the first and second layers each have a thickness of about 30 Å to about 70 Å.

17. The semiconductor device according to claim 14, further comprising:
a fifth layer, having the second percentage of germanium, on the fourth layer; and
a sixth layer, having the first percentage of germanium, on the fifth layer.

18. A method comprising:
forming a gate electrode, having first and second side surfaces, on an active silicon substrate;
forming first spacers on the first and second side surfaces of the gate electrode;
etching first and second cavities, defined by the first spacers, in the active silicon layer;
forming embedded silicon germanium source/drain regions by:
epitaxially growing a first portion of silicon germanium in the first and second cavities at a thickness of about 400 Å to about 800 Å, the first silicon germanium comprising at least 25 atomic % germanium;
epitaxially growing a first layer, comprising about 20 at. % germanium or less, at a thickness of about 30 Å to about 70 Å on the first portion;
epitaxially growing a second layer, comprising at least 25 atomic % germanium, at a thickness of about 30 Å to about 70 Å, on the first layer; and
epitaxially growing a third layer, comprising about 20 at. % germanium or less, at a thickness of about 30 Å to about 70 Å on the second layer;
forming second spacers on the first spacers; and
forming a silicide, at a thickness of about 200 Å extending into the embedded silicon germanium source/drain regions but not into the first portion.

* * * * *